Figure 1:
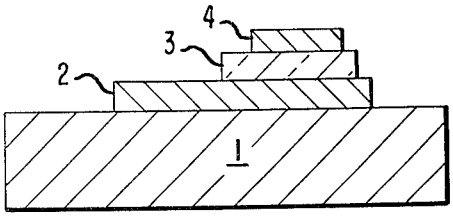
Figure 3:
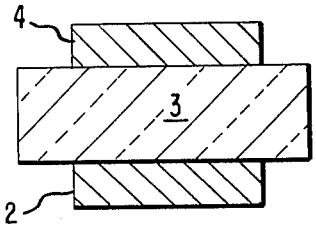
Figure 2:
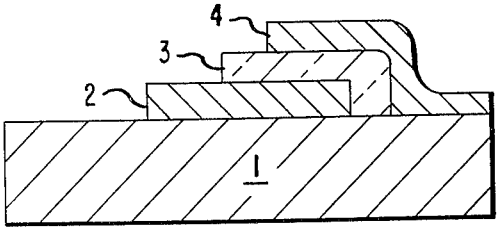
Figure 4:
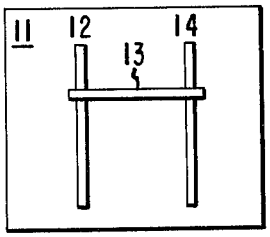

DEFENSIVE PUBLICATION

UNITED STATES PATENT AND TRADEMARK OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent and Trademark Office makes no assertion as to the novelty of the disclosed subject matter.

PUBLISHED MAY 6, 1975

934 OG 10

T934,012

SWITCH OF REDUCED THRESHOLD VOLTAGE

Stephen Charles Thayer, Lewistown, Pa., assignor to E. I. du Pont de Nemours and Company, Wilmington, Del.

Continuation of abandoned application Ser. No. 378,056, July 11, 1973. This application July 25, 1974, Ser. No. 491,670

Int. Cl. B32b *9/04*

U.S. Cl. 357—4

1 Sheet Drawing. 11 Pages Specification

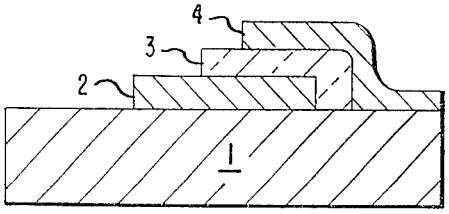

Electronic and/or thermal switches, based upon $VO_2$, having reduced threshold voltage by virtue of using the thickness of the switch layer as the switch length, and/or having high current carrying capacity. Both discrete and thick-film switches are within the invention.

May 6, 1975 S. C. THAYER T934,012

SWITCH OF REDUCED THRESHOLD VOLTAGE

Original Filed July 11, 1973